(12) United States Patent
Magni et al.

(10) Patent No.: US 7,238,014 B2
(45) Date of Patent: Jul. 3, 2007

(54) MANUFACTURING METHOD OF AN ELECTRONIC DEVICE PACKAGE

(75) Inventors: Pierangelo Magni, Villasanta (IT); Andrea Cigada, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 166 days.

(21) Appl. No.: 10/961,489

(22) Filed: Oct. 8, 2004

(65) Prior Publication Data

US 2005/0085033 A1   Apr. 21, 2005

Related U.S. Application Data

(62) Division of application No. 10/036,335, filed on Dec. 26, 2001, now Pat. No. 6,811,738.

(30) Foreign Application Priority Data

Dec. 28, 2000   (EP) .................. 00830854

(51) Int. Cl.
  B29C 45/14 (2006.01)
  B29C 70/72 (2006.01)
  H01L 21/56 (2006.01)
(52) U.S. Cl. .................. 425/116; 425/129.1; 425/389; 425/405.1
(58) Field of Classification Search ................ 425/116, 425/129.1, 389, 405.1
See application file for complete search history.

(56) References Cited

U.S. PATENT DOCUMENTS 4,968,237 A  * 11/1990  Persson ................ 425/129.1

| 5,275,547 A | 1/1994 | Brown ................ 425/129.1 |
| 5,424,249 A | 6/1995 | Ishibashi ................ 438/51 |
| 5,622,873 A | 4/1997 | Kim et al. ................ 438/65 |
| 5,773,322 A | 6/1998 | Weld ................ 438/117 |
| 5,862,248 A | 1/1999 | Salatino et al. ................ 382/124 |
| 5,929,517 A | 7/1999 | Distefano et al. ................ 257/707 |

(Continued)

FOREIGN PATENT DOCUMENTS

EP    0 813 236    12/1997

(Continued)

OTHER PUBLICATIONS

Patent abstracts of Japan, vol. 1998, No. 08 dated Jun. 30, 1998; publication No. 10075040 published on Mar. 17, 1998, entitled "Method for Manufacturing Resin-Coated Circuit Board"; Applicant: Toshiba Chem Corp.

*Primary Examiner*—Robert B. Davis
(74) *Attorney, Agent, or Firm*—Lisa K. Jorgenson; Allen, Dyer, Doppelt, Milbrath & Gilchrist, P.A.

(57) ABSTRACT

A method is for forming a plastic protective package for an electronic device integrated on a semiconductor and comprising an electronic circuit to be encapsulated in the protective package. The electronic device may be at least partially activated from outside of the protective package. The method may include providing a mold having a half-mold with an insert abutting towards the inside of the mold and an end having an element that can be elastically deformed to abut in pressing contact against at least one portion of the integrated circuit. The method may also include injecting a resin into the mold so that the protective package has a hole by the at least one portion of the electronic circuit.

7 Claims, 4 Drawing Sheets

U.S. PATENT DOCUMENTS

| | | | |
|---|---|---|---|
| 5,997,798 A | 12/1999 | Tetreault et al. | 264/510 |
| 6,000,924 A | 12/1999 | Wang et al. | 425/125 |
| 6,164,946 A | 12/2000 | Mess | 425/125 |
| 6,193,493 B1 | 2/2001 | Steijer et al. | 425/116 |
| 6,667,439 B2 | 12/2003 | Salatino et al. | 174/52.1 |

FOREIGN PATENT DOCUMENTS

| | | |
|---|---|---|
| WO | 87/04973 | 8/1987 |
| WO | 94/16544 | 7/1994 |

\* cited by examiner

US 7,238,014 B2

MANUFACTURING METHOD OF AN ELECTRONIC DEVICE PACKAGE

CROSS-REFERENCE TO RELATED APPLICATION

This is a divisional patent application of U.S. patent application Ser. No. 10/036,335 filed Dec. 26, 2001 now U.S. Pat. No. 6,811,738, the disclosure of which is hereby incorporated in its entirety.

FIELD OF THE INVENTION

The present invention is directed to a method for manufacturing a protective package for an electronic device and, more particularly, an electronic device having a pressure sensor, optical sensor or another type of sensor.

BACKGROUND OF THE INVENTION

It is well known that semiconductor electronic devices comprising pressure sensors and optical sensors have become more important and are more frequently used. To access the active portion of the electronic devices that comprises the sensor, it is necessary to form packages that include a window.

FIG. 1 shows a perspective view of a package 1 for an electronic device with a sensor formed according to a first known method. Beginning from a substrate 2, for example, made from semiconductor material, dies made from semiconductor material are formed and comprise an electronic circuit 3. Such dies are encapsulated by a package 4 made from plastic material, which leaves a portion of the electronic circuit 3 uncovered. For example, an overmolding technique is used to form the package 4 such that a liquid epoxy resin 5 is dispensed on the substrate 2 and on the perimeter of the electronic circuit portion that must remain uncovered.

The first method is advantageous for many reasons, but it also has some drawbacks. In fact, this method does not produce regular surfaces like the ones formed using the traditional molding method. Moreover, the dimensions of these packages are not completely checkable and the resin depositing process is not easily repeatable, especially on the electronic circuit surface.

Indeed, a second method uses dams 6 that are placed on the substrate 2, as shown in the sectional view of a package in FIG. 2. Liquid epoxy resin is then dispensed between the dams, the substrate and the electronic circuit perimeter. Although this approach addresses the proposed objective, it presents some disadvantages. In fact, the resin outline on the integrated circuit surface cannot be maintained at a constant level during the production cycle.

Recently, methods using standard molding techniques for the production of semiconductor packages with a window have been introduced. FIG. 3 shows a sectional view of a mold 7 that comprises a half-mold 7a and a half-mold 7b, which define a space 7c for containing the electronic device 3 when they are laid on each other. According to this known technique, the upper half-mold 7b internally comprises a spring clamp 8 placed in a position almost corresponding to the portion of the electronic circuit to be left uncovered.

Such a spring clamp 8 basically has a parallelepiped shape and is slid into a recess in the upper half-mold 7b. The spring clamp 8 is biased by elastic elements, for example springs. When the half-mold 7b is laid on the half-mold 7a, the spring clamp 8 abuts against the device surface that is to be left empty. A high temperature molten epoxy resin is then injected in the mold to form the plastic package.

Although this method is advantageous for many reasons, it presents the drawback of damaging the circuit operation. In fact, the force applied on the two half-molds during the reciprocal coupling, to prevent the resin from pouring out of the molds when the injection occurs, is about 10-30 tons. Indeed, the force of the spring clamp abutting down against the electronic circuit does not have to be higher than 100 Kilos to possibly damage the electronic circuit 3. The presence of the spring clamp partially allows the force of the floating clamp abutting the electronic circuit to be modulated. Nevertheless, the direct contact of the metallic clamp against the active surface of the circuit can damage the functionality of the circuit, as shown in FIG. 4.

A further drawback occurs when the electronic circuit is tilted on the clamp surface, as shown in FIG. 5. In fact, the method shows an undesired resin infiltration during the mold-filling phase. Also, the electronic circuit surface that is not perfectly parallel to the support is damaged. It has been suggested to coat the mold and the spring clamp with a film tape 9, as shown in FIG. 6, to reduce the possibility of damaging the electronic circuit during, coupling of the two half-molds. Nevertheless, this method can correct only small irregularities of the integrated circuit. The film tape 9 must be also substituted at every new production phase, thereby increasing the production costs.

Further, the uniform deposition of the film tape on the half-mold is very critical. The mold used in conventional molding techniques provides a plurality of mold shapes having adjacent cavities to simultaneously form a plurality of packages. Therefore, the spring clamp must be introduced into the mold for each device to be molded. All of these inserts increase the possibility of having a part of the resin fill the spaces between the mobile portions during the mold-filling phase, thereby causing a jam or a yield reduction due to the resin being deposited on the integrated circuit surface.

SUMMARY OF THE INVENTION

In view of the foregoing background, it is therefore an object of the present invention to provide a method for manufacturing protective packages having a window and presenting features to overcome the manufacturing method drawbacks of prior art.

The present invention forms protective packages for electronic devices by using a mold having an insert or lug. Advantageously, such an insert also comprises an elastic membrane fitting itself to the integrated circuit surface when the mold closes down. In particular, the membrane is urged or biased by a pressured fluid, towards and in pressing contact against the circuit. During the injection phase of the insulating material, a window in the package is formed by the membrane.

More specifically, the invention makes reference to a method for forming a protective package made out of plastic material for an electronic circuit integrated on a semiconductor substrate and comprising an electronic circuit that can be at least partially activated from the outside of the protective package and that is to be encapsulated in the protective package.

Furthermore, the invention is directed to a mold for molding a plastic protective package encapsulating an integrated electronic circuit that can be at least partially activated from the outside of the protective packaging. The mold is formed by a pair of half-molds laid on each other to make a space for containing the integrated circuit. The invention particularly relates, but not exclusively, to a method for forming a protective package made out of plastic material for an integrated electronic device having a window to at least partially access the electronic device. The following description is made with reference to this field and only to simplify its explanation.

BRIEF DESCRIPTION OF THE DRAWINGS

The features and the advantages of the method according to the invention will be apparent in the following description, of the formation of a mold, given by way of a non-limiting example with reference to the accompanying drawings. In such drawings.

DETAILED DESCRIPTION OF THE PREFERRED EMBODIMENTS

Figure 1:
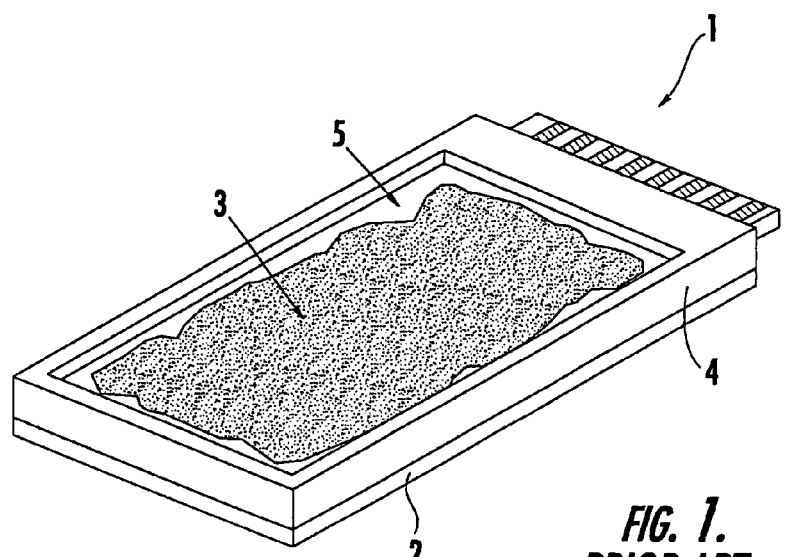
FIG. 1 shows a schematic perspective view of a protective package for an electronic device according to the prior art.
Figure 2:
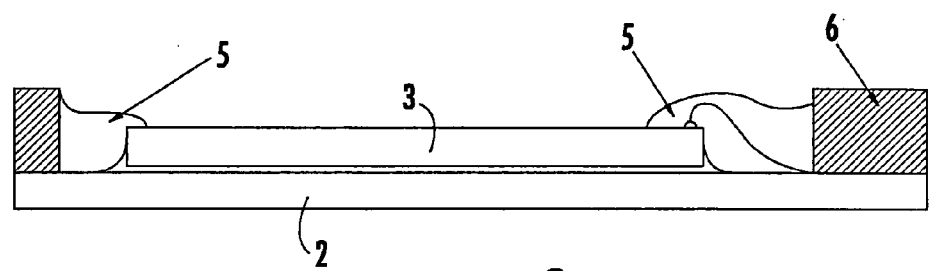
FIG. 2 shows a cross-sectional view of a protective package for an electronic device according to the prior art.
Figure 3:
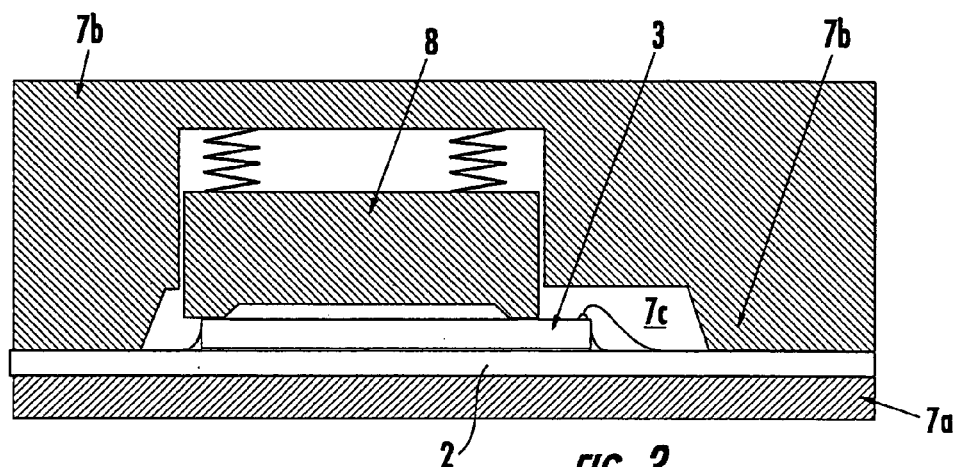
FIG. 3 shows a cross-sectional, enlarged view of a mold for forming a protective package for an electronic device according to the prior art.
Figure 4:
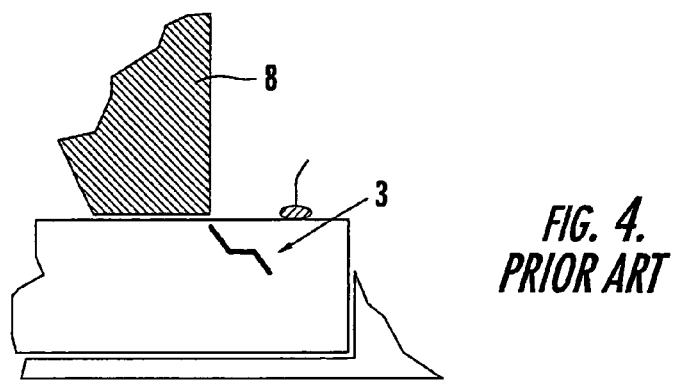
FIG. 4 shows a cross-sectional view of the protective package formed according to the prior art.
Figure 5:
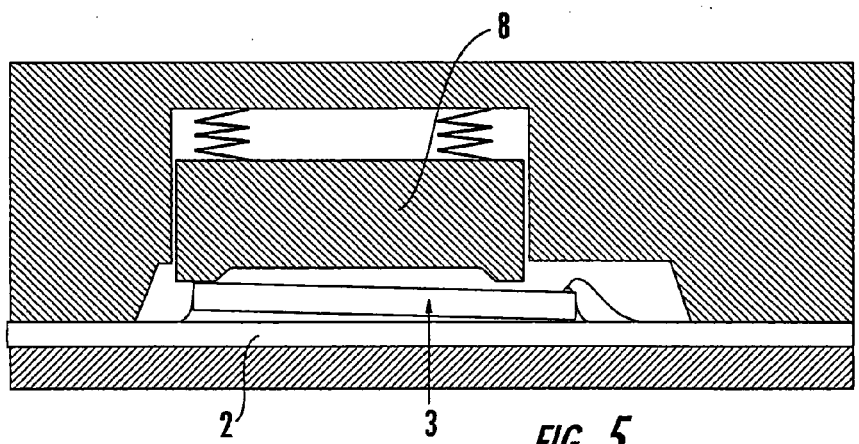
FIG. 5 shows a cross-sectional, enlarged view of an alternate embodiment of a mold for forming a protective package according to the prior art.
Figure 6:
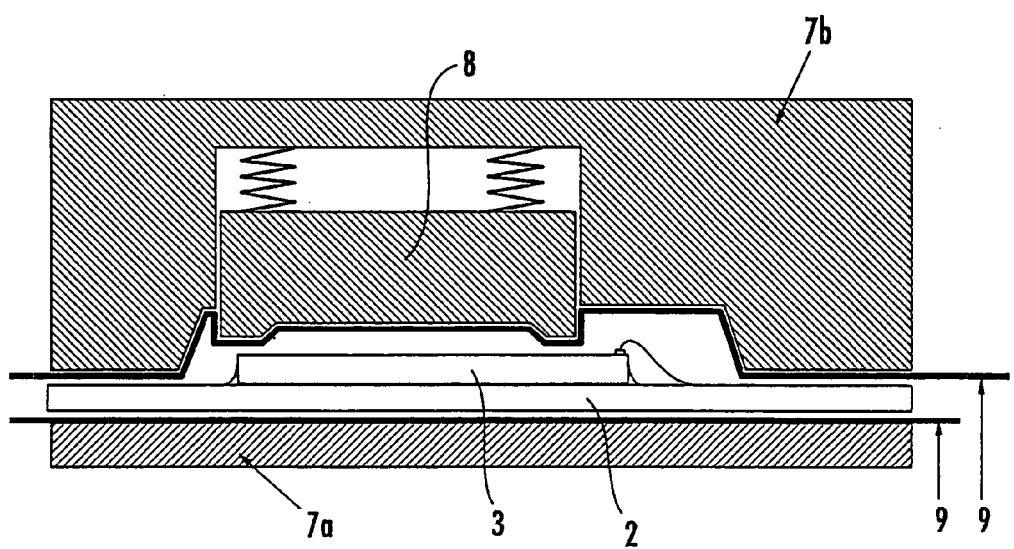
FIG. 6 shows a cross-sectional, enlarged view of a mold according to the prior art.
Figure 7:
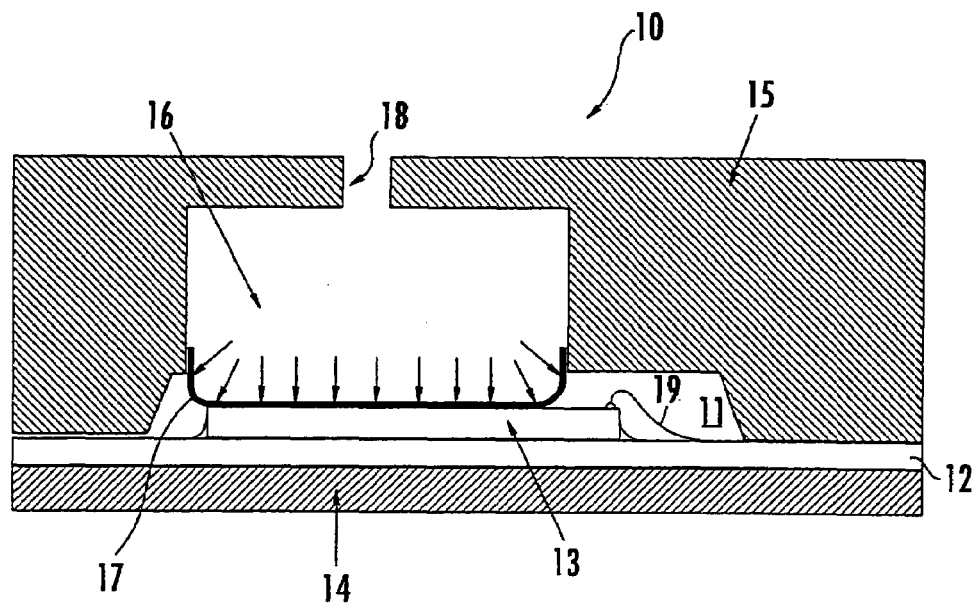
FIG. 7 shows a cross-sectional, enlarged view of a mold for forming a protective package for an electronic device according to the present invention.
Figure 8:
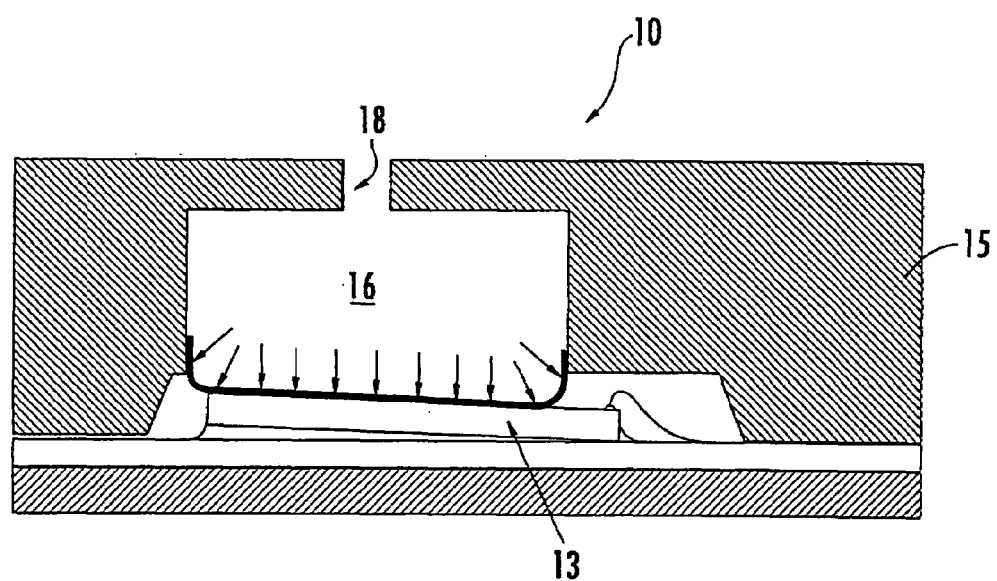
FIG. 8 shows a cross-sectional view of an alternate embodiment of the mold, shown in FIG. 7, according to the present invention.
Figure 9:
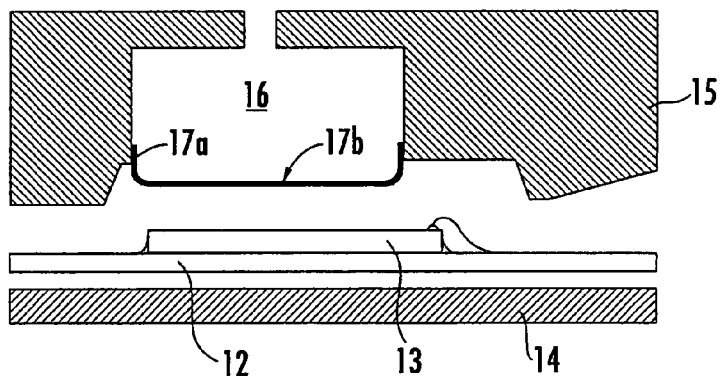
FIGS. 9-12 show a mold and the different successive steps for forming a protective package according to present invention.

With reference to FIGS. 7 and 8, a mold 10 formed according to the invention for obtaining a protective package with a window is shown. The mold 10 shows a space 11 containing the electronic circuit 13 and for receiving injected insulating material, for example, resin. In FIGS. 7-12, a vertical section of only one mold defining only one cavity is shown even though in conventional molding techniques the mold has a plurality of adjacent cavities for simultaneously forming a plurality of packages.

Inside the containing space 11 a lead frame 12 is placed, for example a metallic frame, on a plastic substrate or a ceramic substrate on which an electronic circuit 13 comprising a sensor is fastened. The sensor may be a touch type proximity sensor, an optic type, pressure type, fingerprint identification type, or another similar type of sensor. The following description makes reference to these types of sensors.

The invention may obviously be applied to all electronic devices that must have a surface portion in direct communication with the outside of the package, even though they are encapsulated in a protective package. Basically, the mold 10 comprises two half-parts: a half-mold, or lower half-shell 14, and a half-mold, or upper half-shell 15, which form a space 11 for containing the electronic circuit 13 when the two half-molds are closed.

According to the invention, the upper half-mold 15 has an insert or lug which is formed from an element 17 made out of a material that can be elastically deformed, abutting in pressing contact against the electronic circuit 13. In a preferred embodiment, the upper half-mold 15 has a cavity 16 that is substantially defined by the half-mold 15 and by the element 17 made out of a material that can be elastically deformed. Advantageously, the element 17 is an elastic membrane. The membrane 17 is preferably made out of an elastomer.

In an alternate embodiment, the membrane 17 is bowl shaped and is obtained by molding, for example. The membrane comprises a cylindrical skirt 17a and a bottom 17b. At least one portion of the cylindrical skirt 17a is maintained against the walls of the cavity 16. The cavity 16 is in communication with the outside of the mold through an opening 18. After the two half-molds 14 and 15 have clamped together, the cavity 16 is pressure filled through the opening 18. The bottom 17b of the membrane perfectly adheres to the circuit 13 surface and abuts in pressing contact with the circuit. Afterwards, injecting insulating material, for example epoxy resin, into the space 11 carries out the phase of forming the protective package 9. Different thermodynamic processes of polymerization and resin-curing follow the injection step.

With reference to FIGS. 9-12, the method of forming a plastic protective package is now described according to the invention. FIGS. 9-12 show a metallic lead frame 12 on which a die is mounted. An integrated circuit 13 is formed in the die. The integrated circuit 13 comprises, for example, a sensor that can be activated from the outside of the protective package and connected to control circuitry. The electronic circuit is connected to pins through thin conductor or bond wires 19 for establishing external electrical connections.

Figure 10:
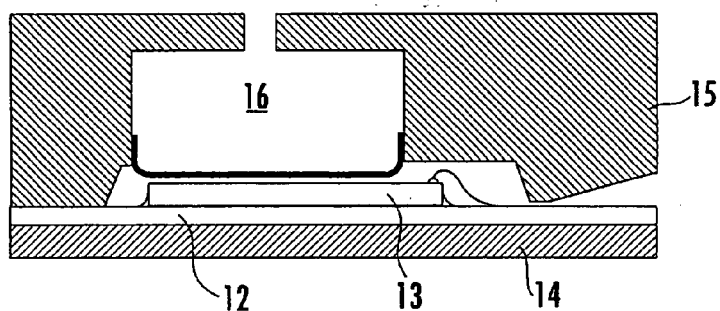
Figure 11:
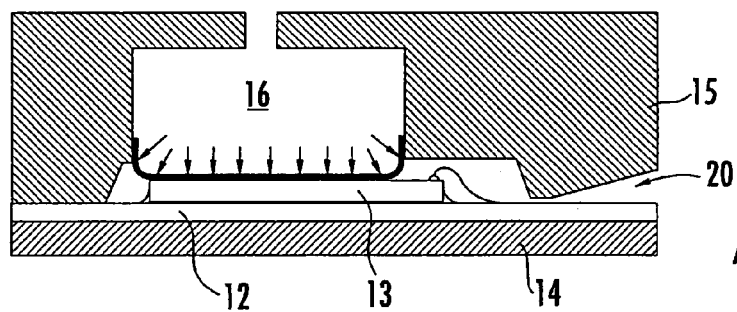
Figure 12:
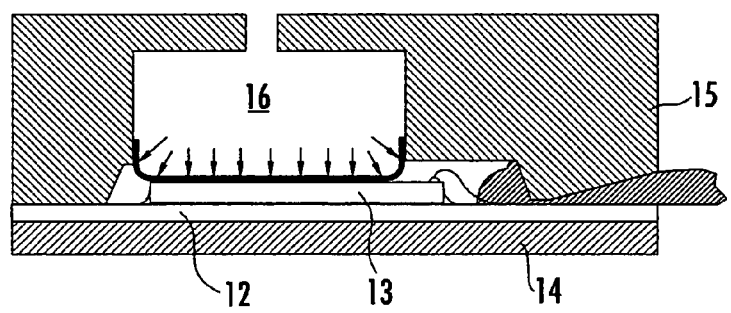

Advantageously, the lead frame 12 is positioned on the bottom of the molding cavity and, particularly, in the hollow space formed by the lower half-mold 14. The lead frame 12 can also be placed in the middle of the containing space 11. According to the invention, once the lead frame is placed on the lower half-mold 14, the upper half-mold 15 is then laid on the lower half-mold 14 obtaining a containing space 11 between the two half-molds, as shown in FIG. 10.

As it has already been disclosed in the prior art, a pressure is exerted onto the two half-molds such that they are clamped together when the material for forming the protective package is injected, according to the invention. When the upper half-mold 15 is fastened to the lower half-mold 11, the membrane 17 is not in contact with the integrated circuit 13. According to the invention, the cavity 16 of the mold 10 defined by the membrane 17, is filled with a pressure fluid at a predetermined value. The fluid pressure is then regulated at a suitable value.

In particular, the fluid pressure inside the cavity 16 is higher than the pressure at which the resin is injected in the mold for forming the package of plastic material. For such a purpose, the best results are obtained at a fluid pressure between 60 to 70 Mpa. Therefore, the pressure of the fluid applied to the membrane 17 allows the bottom 17b of the membrane to abut in pressing contact against the surface of the circuit 13, which has to be exposed, guaranteeing that its seal will prevent any infiltrations from contacting the circuit.

In particular, the pressing force stresses a surface of the bottom 17b while the opposite surface of the bottom 17b presses against the electronic circuit 13 thereby leaving the entire border of the electronic circuit uncovered. Thus, the protective package will completely cover the circuit 13 border. As shown in FIGS. 9-12, the membrane 17 may also cover a side of the electronic circuit 13. Thus, the protective package of the invention will cover only the circuit 13 border which is left free from the membrane 17.

Afterwards, the phase of forming the protective package is carried out. A molten plastic material, for example an epoxy resin at high temperature, is pressure injected in the cavity made between the half-molds through an injection opening 20 and through suitable channels that are not represented. The presence of the membrane 17 is such that it becomes a barrier to the stream-of insulating material during the injection. The final protective package is then provided with a window or hole aligned with the integrated circuit 13.

To conclude, the method of the invention avoids the direct contact of metallic parts against the active part of the integrated circuit 13. A further advantage of the method, according to the invention, overcomes any possible misalignment of the integrated circuit 13, for example, due to the faulty planarity of the substrate or of the surface of the integrated circuit, with the presence of the flexible membrane. Further, the inventive mold allows a greater number of packages to be formed compared to the number of packages formed according to prior art. The mold also allows the use of manufacturing processes with improved tolerances.

Further, the inventive mold simplifies the formation of the mold by removing all its mobile mechanical parts. Advantageously, with the mold and the method according to the invention, it is possible to adapt the intensity of the pressing contact against the integrated circuit from time-to-time during the production to thereby regulate the fluid pressure.

The invention claimed is:

1. A mold for molding a plastic protective package for encapsulating an integrated circuit comprising a sensor, the mold comprising:
    first and second half-molds which are laid onto each other to form a space for containing the integrated circuit; and
    an elastically deformable insert connected to the first half-mold and, in response to fluid pressure, projecting substantially towards the integrated circuit to abut in pressing contact against an outer surface of the sensor during a molding phase.

2. A mold according to claim 1, wherein the first half-mold has an opening therein for connection to a fluid pressure source.

3. A mold according to claim 1, wherein the insert comprises a cylindrical skirt connected to adjacent portions of the first half-mold, and an end carried by the cylindrical skirt.

4. A mold for molding a plastic protective package for encapsulating an integrated circuit comprising a sensor, the mold comprising:
    first and second half-molds comprising metal and which are laid onto each other to form a space for containing the integrated circuit; and
    an elastically deformable membrane connected to the first half-mold and, in response to fluid pressure, projecting substantially towards the integrated circuit to abut in pressing contact against an outer surface of the sensor during a molding phase;
    said first half-mold having an opening therein communicating with a back face of said elastically deformable membrane and for connection to a fluid pressure source.

5. A mold according to claim 4, wherein said elastically deformable membrane comprises a cylindrical skirt connected to adjacent portions of the first half-mold, and an end carried by the cylindrical skirt.

6. A mold according to claim 1, wherein the sensor comprises at least one of an optical sensor, a pressure sensor and a fingerprint identification sensor.

7. A mold according to claim 4, wherein the sensor comprises at least one of an optical sensor, a pressure sensor and a fingerprint identification sensor.

* * * * *